(12) United States Patent
Matsui et al.

(10) Patent No.: US 9,490,741 B2
(45) Date of Patent: Nov. 8, 2016

(54) MOTOR CONTROL DEVICE

(75) Inventors: Hirokazu Matsui, Hatachinaka (JP); Hiroyuki Yamada, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 24 days.

(21) Appl. No.: 14/343,088

(22) PCT Filed: Jul. 25, 2012

(86) PCT No.: PCT/JP2012/068851
§ 371 (c)(1),
(2), (4) Date: Mar. 6, 2014

(87) PCT Pub. No.: WO2013/046893
PCT Pub. Date: Apr. 4, 2013

(65) Prior Publication Data
US 2014/0217935 A1   Aug. 7, 2014

(30) Foreign Application Priority Data

Sep. 26, 2011 (JP) ................................ 2011-209814

(51) Int. Cl.
*B60W 10/26* (2006.01)
*B60W 20/00* (2016.01)
(Continued)

(52) U.S. Cl.
CPC ............ *H02P 27/06* (2013.01); *B60L 3/0046* (2013.01); *B60L 3/12* (2013.01); *B60L 7/14* (2013.01); *B60L 11/005* (2013.01); *B60L 11/1803* (2013.01); *B60L 11/1851* (2013.01); *B60L 11/1861* (2013.01); *B60L 15/20* (2013.01); *B60L 15/2045* (2013.01); *H01M 10/441* (2013.01); *B60L 2240/12* (2013.01); *B60L 2240/14* (2013.01); *B60L 2240/421* (2013.01); *B60L 2240/423* (2013.01); *B60L 2240/425* (2013.01); *B60L 2240/427* (2013.01); *B60L 2240/429* (2013.01); *B60L 2240/545* (2013.01);
(Continued)

(58) Field of Classification Search
None
See application file for complete search history.

(56) References Cited

U.S. PATENT DOCUMENTS 6,064,179 A * 5/2000 Ito .................... G01R 19/16542
320/128

(Continued)

FOREIGN PATENT DOCUMENTS

JP    6-62503 A    3/1994
JP    2004-7978 A    1/2004
(Continued)

OTHER PUBLICATIONS

Corresponding International Search Report with English Translation dated Oct. 30, 2012 (four (4) pages).

*Primary Examiner* — Eduardo Colon Santana
*Assistant Examiner* — Cortez Cook
(74) *Attorney, Agent, or Firm* — Crowell & Moring LLP

(57) ABSTRACT

A motor control device according to the invention includes: a mode setting section that sets one of a first mode in which a charge/discharge current of a secondary battery varies according to load fluctuation of a motor and a second mode in which the charge/discharge current of the secondary battery becomes constant for a predetermined time regardless of the load fluctuation of the motor; and a drive signal generating section that generates a drive signal for driving the motor on the basis of the mode that is set by the mode setting section, a torque command value, and a motor rotation speed.

8 Claims, 15 Drawing Sheets

(51) Int. Cl.
*H02P 27/06* (2006.01)
*B60L 11/00* (2006.01)
*B60L 11/18* (2006.01)
*B60L 15/20* (2006.01)
*H01M 10/44* (2006.01)
*B60L 3/00* (2006.01)
*B60L 3/12* (2006.01)
*B60L 7/14* (2006.01)
*H01M 10/48* (2006.01)
*G01R 31/36* (2006.01)
*G01R 31/00* (2006.01)

(52) U.S. Cl.
CPC ..... *B60L 2240/547* (2013.01); *B60L 2240/549* (2013.01); *B60L 2240/642* (2013.01); *B60L 2250/26* (2013.01); *B60L 2260/26* (2013.01); *G01R 31/007* (2013.01); *G01R 31/362* (2013.01); *H01M 10/482* (2013.01); *Y02T 10/644* (2013.01); *Y02T 10/645* (2013.01); *Y02T 10/705* (2013.01); *Y02T 10/7005* (2013.01); *Y02T 10/7022* (2013.01); *Y02T 10/7044* (2013.01); *Y02T 10/7275* (2013.01); *Y02T 10/7283* (2013.01); *Y02T 10/7291* (2013.01); *Y02T 90/16* (2013.01)

(56) References Cited

U.S. PATENT DOCUMENTS

| | | | |
|---|---|---|---|
| 2003/0218447 A1* | 11/2003 | Coates | B60K 6/445 320/134 |
| 2007/0241715 A1* | 10/2007 | Fujiwara | H02P 21/14 318/609 |
| 2009/0093337 A1* | 4/2009 | Soliman | B60K 6/442 477/5 |
| 2009/0206828 A1* | 8/2009 | Yamaura | G01B 7/30 324/207.25 |
| 2009/0222158 A1 | 9/2009 | Kubota et al. | |
| 2009/0309545 A1* | 12/2009 | Kunimitsu | H02J 7/0016 320/118 |
| 2010/0051367 A1* | 3/2010 | Yamada | B60K 6/445 180/65.265 |
| 2010/0204863 A1* | 8/2010 | Sakamoto | B60K 6/445 701/22 |

FOREIGN PATENT DOCUMENTS

| | | |
|---|---|---|
| JP | 2008-276970 A | 11/2008 |
| JP | 2009-208512 A | 9/2009 |
| JP | 2011-97729 A | 5/2011 |
| JP | 2011097729 A * | 5/2011 |

* cited by examiner

FIG.3

FIRST CURRENT COMMAND TABLE 301

|  | $N_0$ | $N_1$ | .. | $N_n$ |
|---|---|---|---|---|
| $T_0$ | $I^*_{00X}$ | $I^*_{10X}$ | .. | $I^*_{n0X}$ |
| $T_1$ | $I^*_{01X}$ | $I^*_{11X}$ | .. | $I^*_{n1X}$ |
| .. | .. | .. | .. | .. |
| $T_n$ | $I^*_{0nX}$ | $I^*_{1nX}$ | .. | $I^*_{nnX}$ |

SECOND CURRENT COMMAND TABLE 302

|  | $N_0$ | $N_1$ | .. | $N_n$ |
|---|---|---|---|---|
| $T_0$ | $I^*_{00Z}$ | $I^*_{10Z}$ | .. | $I^*_{n0Z}$ |
| $T_1$ | $I^*_{01Z}$ | $I^*_{11Z}$ | .. | $I^*_{n1Z}$ |
| .. | .. | .. | .. | .. |
| $T_n$ | $I^*_{0nZ}$ | $I^*_{1nZ}$ | .. | $I^*_{nnZ}$ |

FIRST BATTERY CURRENT TABLE 303

|  | $N_0$ | $N_1$ | .. | $N_n$ |
|---|---|---|---|---|
| $T_0$ | $IB_{00X}$ | $IB_{10X}$ | .. | $IB_{n0X}$ |
| $T_1$ | $IB_{01X}$ | $IB_{11X}$ | .. | $IB_{n1X}$ |
| .. | .. | .. | .. | .. |
| $T_n$ | $IB_{0nX}$ | $IB_{1nX}$ | .. | $IB_{nnX}$ |

SECOND BATTERY CURRENT TABLE 304

|  | $N_0$ | $N_1$ | .. | $N_n$ |
|---|---|---|---|---|
| $T_0$ | $IB_{00Z}$ | $IB_{10Z}$ | .. | $IB_{n0Z}$ |
| $T_1$ | $IB_{01Z}$ | $IB_{11Z}$ | .. | $IB_{n1Z}$ |
| .. | .. | .. | .. | .. |
| $T_n$ | $IB_{0nZ}$ | $IB_{1nZ}$ | .. | $IB_{nnZ}$ |

MOTOR CONTROL DEVICE

TECHNICAL FIELD

The present invention relates to a motor control device.

BACKGROUND ART

In general, multiple electric motors are mounted in an electric drive vehicle such as a hybrid electric vehicle (HEV) and an electric vehicle (EV), and particularly, a high-power electric motor is used as a driving force. As a power source that supplies power to the electric motor used as the driving force, a battery that is formed of a battery pack including plural secondary battery cells such as nickel hydrate battery cells or lithium battery cells is used. A State of Charge (SOC) is used as a parameter that indicates a charging state of the battery. For estimating the SOC during traveling of a vehicle, in general, a method is widely used in which open circuit voltage OCV is calculated from closed circuit voltage CCV during traveling of the vehicle, polarization voltage, internal resistance, and a battery current integrated value and in which the SOC is estimated from the thus-calculated OCV.

The CCV of the each secondary battery that constitutes the battery pack is measured for measurement of the CCV during traveling of the vehicle, the OCV and the SOC of the each secondary battery are then calculated from the measured values, and the SOC of the battery as a whole is further calculated. However, because charging and discharging are frequently repeated during traveling of the vehicle, it is difficult to detect the CCVs of all the secondary battery cells in an identical condition, and an error occurs to a certain extent in detection of the CCV of the each secondary battery cell. The error in the detection of battery voltage values of these secondary battery cells is accumulated, an error is also produced in the calculated SOC of the battery with respect to the actual SOC, and this error is gradually accumulated. Considering the above, a method of accurately calculating the SOC by measuring the CCV in a state where the battery is driven with a constant current has been suggested (see PTL 1).

However, a power source system that is described in PTL 1 and used to supply power to the electric motor includes plural batteries and plural converters, controls the plural converters to charge or discharge some of the plural batteries with the constant current, and charges and discharges the rest of the batteries in response to a power request by a driving force generating section, and in the meantime, a battery controller estimates the SOC of the battery on the basis of the voltage of the battery during charging or discharging with the constant current.

CITATION LIST

Patent Literature

PTL 1: JP-A-2008-276970

SUMMARY OF INVENTION

Technical Problem

In the conventional motor control device, in order to accurately calculate the SOC of the host battery, an additional battery has to be used to drive with a constant current the host battery that drives the electric motor for driving the HEV or the EV and whose SOC is subjected to measurement. This increases the number of the batteries, thereby increasing cost.

Solution to Problem

According to a first aspect of the invention, a motor control device includes: a mode setting section that sets one of a first mode in which a charge/discharge current of a secondary battery is changed according to load fluctuation of a motor and a second mode in which the charge/discharge current of the secondary battery becomes constant for a predetermined time regardless of the load fluctuation of the motor; and a drive signal generating section that generates a drive signal for driving the motor based on the mode that is set by the mode setting section, a torque command value, and a motor rotation speed.

According to a second aspect of the invention, in the motor control device of the first aspect, it is preferable that the mode setting section sets one of the first mode and the second mode based on a signal from an external controller.

According to a third aspect of the invention, in the motor control device of the second aspect, it is preferable that the mode setting section sets the second mode during a hill-hold travel in which torque fluctuation of the motor is relatively small.

According to a fourth aspect of the invention, in the motor control device of the second aspect, it is preferable that the mode setting section sets the second mode during a hill-climb travel in which the torque of the motor acts only in a discharging direction.

According to a fifth aspect of the invention, in the motor control device of the second aspect, it is preferable that the mode setting section sets the second mode during a downhill travel in which the torque of the motor acts only in a charging direction.

According to a sixth aspect of the invention, in the motor control device of the second aspect, it is preferable that the mode setting section sets the second mode during a high-speed cruise travel in which the torque fluctuation of the motor is relatively small.

According to a seventh aspect of the invention, in the motor control device of the second aspect, it is preferable that the mode setting section sets the second mode during a reverse travel in which the torque fluctuation of the motor is relatively small.

According to an eighth aspect of the invention, an electric drive control apparatus for a vehicle includes: the motor control device of the first aspect; a secondary battery voltage measuring section that measures inter-terminal voltage (CCV) of the secondary battery when the motor is driven in the second mode; and an SOC calculating section that calculates OCV of the secondary battery based on the inter-terminal voltage (CCV) of the secondary battery measured by the secondary battery voltage measuring section.

According to a ninth aspect of the invention, a control apparatus for a vehicle includes: the motor control device of the first aspect; the secondary battery voltage measuring section that measures inter-terminal voltage (CCV) of the secondary battery when the motor is driven in the second mode; the SOC calculating section that calculates the OCV of the secondary battery based on the inter-terminal voltage (CCV) of the secondary battery measured by the secondary battery voltage measuring section; a determining section that determines one of the hill-hold, hill-climb, high-speed cruise, and reverse travels; and a command section that commands the motor control device to set the second mode when the determining section determines one of the hill-hold, hill-climb, high-speed cruise, and reverse travels.

Advantageous Effects of Invention

In the motor control device according to the invention, it is possible to use only one battery for the constant current drive of the battery in order to measure the CCV of the secondary battery cell, to compute the OCV on the basis of the accurate CCV measurement, and to calculate the SOC further accurately. Due to the above, the structure as well as control of the battery is simplified, and the battery cost can be reduced.

BRIEF DESCRIPTION OF DRAWINGS

FIG. 3 is tables for explaining data used by a current command determining section in the embodiment of the motor control device according to the invention. Tables 301, 302 respectively indicate lower limits and upper limits of an effective AC current for the motor control that are calculated in a second current command determining section, and tables 303, 304 indicate an effective DC current for a battery that respectively correspond to the tables 301, 302.

DESCRIPTION OF EMBODIMENTS

A description will hereinafter be made on embodiments of the invention with reference to FIGS. 1 to 14.

Figure 1:
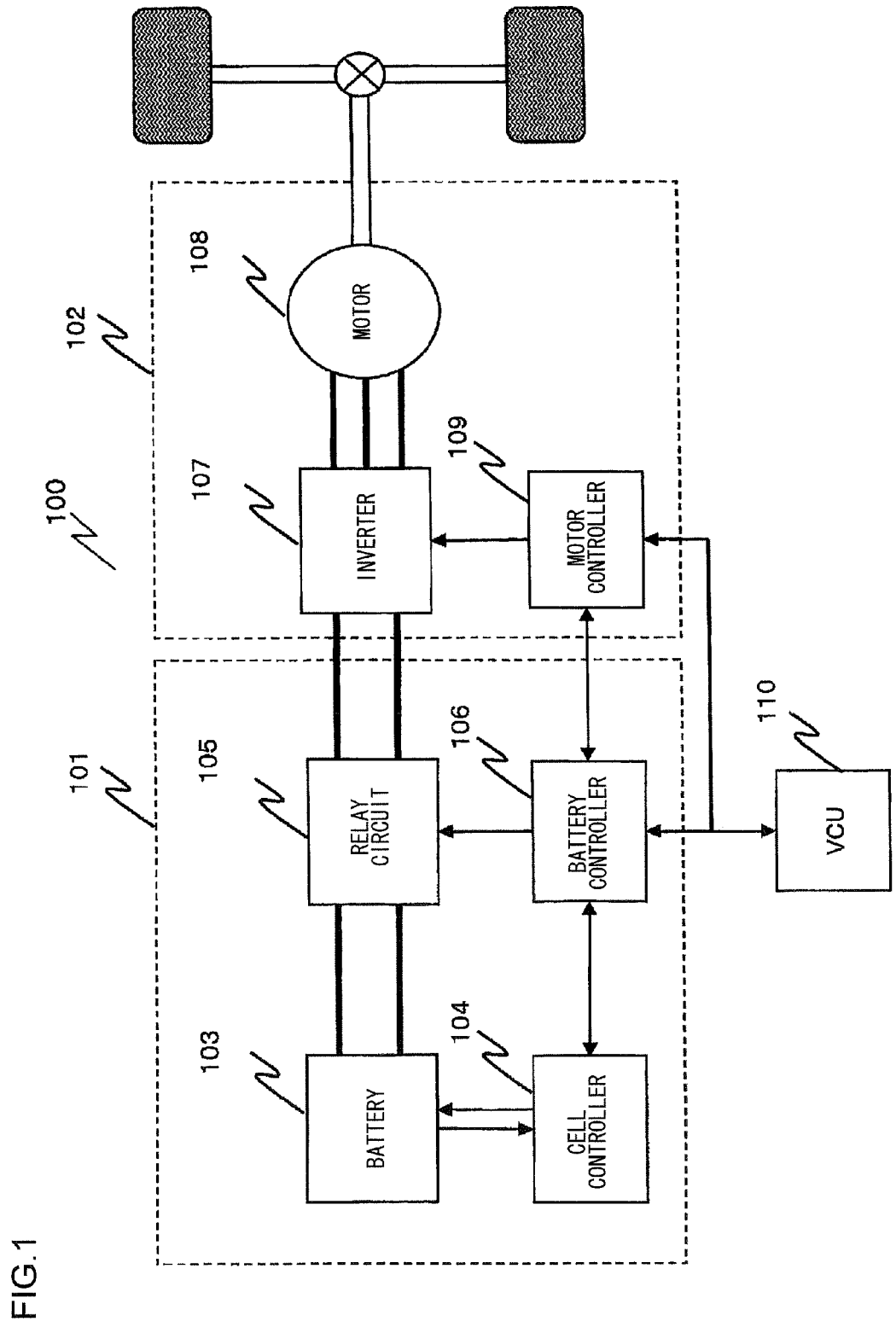
FIG. 1 is a schematic diagram for illustrating an overall structure of an electric drive apparatus that includes an embodiment of a motor control device according to the invention.

FIG. 1 is an overall block diagram of a vehicle 100 such as an electric vehicle (EV) in which a motor control device of a first embodiment according to the invention is mounted. The vehicle includes a power source unit 101 and a motor drive unit 102. The power source unit 101 includes a battery 103, a cell controller 104 that monitors a battery state, and a relay circuit 105 that can connect and disconnect an inverter 107 and the battery 103. In addition, a battery controller 106 is included, for example, that calculates a charging state (SOC; State of Charge) of the battery as well as performs and interrupts power supply to the motor drive unit 102.

As the battery 103, the battery that is formed of a battery pack including plural secondary battery cells such as nickel hydrate battery cells or lithium battery cells is used. In addition, the plural secondary battery cells form a cell group in which several to ten or more of the battery cells are connected in series, and the battery, that is, the battery pack includes the several cell groups that are connected in series or in series parallel.

Battery state data (such as inter-terminal voltage and a temperature of the secondary battery cell) that is acquired in the cell controller 104 is transmitted to the battery controller 106 via a communication path (represented by an arrow in FIG. 1). Based on the received battery state data, the battery controller 106 calculates the SOC of the entire battery and that of the each secondary battery and also calculates a DC power limit value from the battery 103 to the motor drive unit 102 and the like.

Meanwhile, the motor drive unit 102 includes at least one inverter 107 and a motor 108. The inverter 107 is driven and controlled by a signal from a motor controller 109 for driving and controlling the motor 108. The motor controller 109 generates a drive signal for the inverter 107 such that the motor is driven at a torque target value or a rotation speed target value, for example, that is received from an external controller 110 or the like via the communication path or the like, and controls generated torque or a rotation speed of the motor. Although a converter and the like are not shown in the structure illustrated in FIG. 1, such equipment may be provided.

Figure 2:
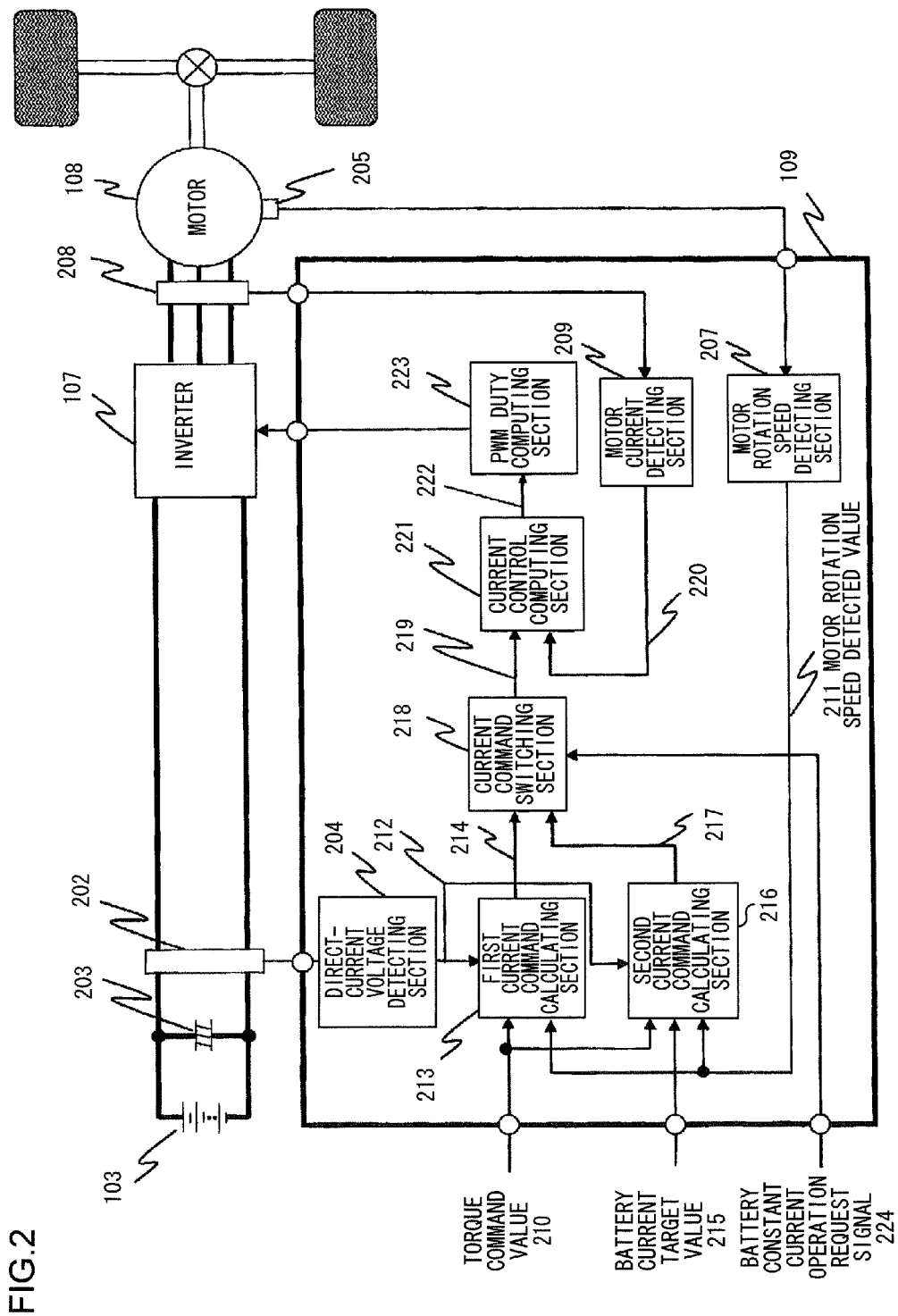
FIG. 2 is a block diagram for showing a structure of a motor drive unit 102 in the electric drive apparatus that is shown in FIG. 1.

FIG. 2 shows a detailed structure of a motor control computation section in a motor control device (motor controller) 109 of the embodiment according to the invention. The motor control device 109 includes a direct-current (DC) voltage detecting section 204 that detects terminal voltage of a capacitor 203 from an output of a DC voltage sensor 202, a motor rotation speed detecting section 207 that detects the motor rotation speed from an output of a motor rotation sensor 205, and a motor current detecting section 209 that detects a motor drive current from an output of a current sensor 208. Furthermore, a first current command calculating section 213 that calculates an output current in a d-q space on the basis of a torque command value 210, a motor rotation speed detected value 211, and a DC voltage detected value 212, and a second current command calculating section 216 that calculates the output current in the d-q space that corresponds to the torque command value 210, the motor rotation speed detected value 211, the DC voltage detected value 212, and a battery current target value 215 are included.

In addition, a current command switching section 218 is included that switches between and outputs a current command value for normal operation 214 that is an output value from the first current command calculating section 213 and a current command value for battery constant current operation 217 that is an output value from the second current command calculating section 216 by a battery constant current operation request signal 224. Furthermore, a current control computing section 221 that outputs a current control value 222 for controlling a three-phase output current to the motor 108 on the basis of a current command value 219 output from the current command switching section 218 and a current detected value 220 output from the motor current detecting section, and a PWM duty computing section 223 that determines a PWM duty on the basis of the current control value 222 and that generates a signal for driving the inverter 107 in the duty, are included. It should be noted that voltage of the capacitor 203 is theoretically the same as voltage of the battery 103.

Based on the torque command value 210 and the current motor rotation speed detected value 211, the first current command calculating section 213 determines a current command value at which loss of the motor can be minimized within an adjustable range when the motor 108 outputs the desired torque. In other words, in the normal operation, the current command value for normal control 214 that is output from the first current command calculating section 213 is used to control the motor.

Meanwhile, based on the torque command value 210, the current motor rotation speed detected value 211, the DC voltage detected value 212, and the battery current target value 215, the second current command calculating section 216 determines a current command that allows the motor 108 to output the desired torque and by which the battery current reaches a target value.

(Principle of Constant Current Drive of the Motor)

A description will be made on constant current drive of the motor in the motor control device according to the invention with reference to FIG. 13.

(Normal Motor Operation)

Figure 13:
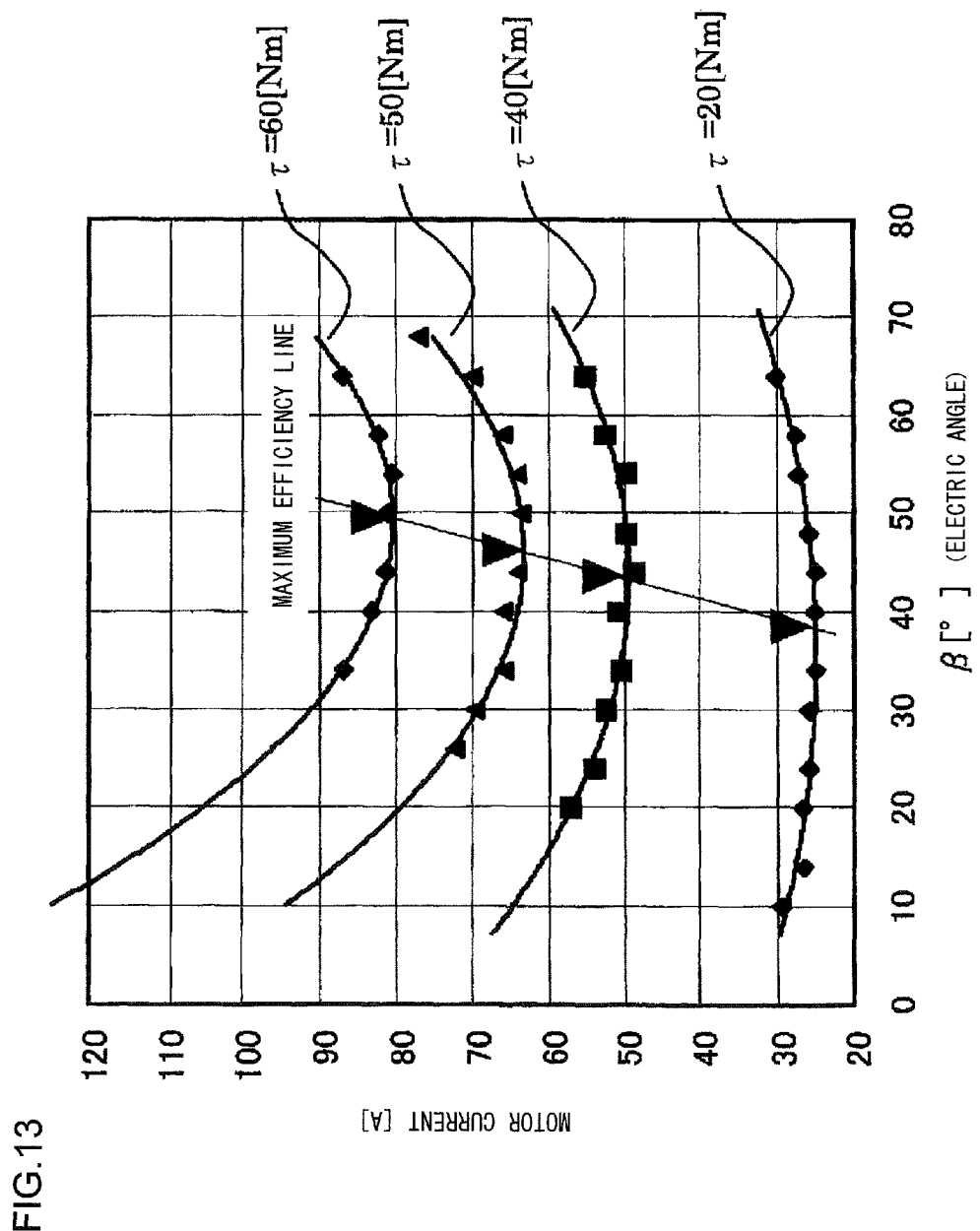
FIG. 13 is a graph for explaining normal motor drive operation.

FIG. 13 is a conceptual diagram for showing a curve for each rotational torque in a condition that the rotational torque is constant with respect to the motor current that is the three-phase AC current (amplitude) supplied to a stator coil and a phase of the current (electric angle) when the motor 108 is an IPM motor.

It should be noted that the rotation speed of the motor 108 is constant in FIG. 13. As will be described later, there are a wide variety of conditions for the constant rotation speed of the motor 108, that is, driving states at a constant speed of an electric drive vehicle that is driven by the motor 108. In addition, because the motor rotation speed and the required rotational torque are varied according to a driving speed or a driving environment, the state shown in FIG. 13 is merely one example. Furthermore, when the vehicle is in a downhill travel, the motor 108 performs a regenerative operation, and thus a drive state of the motor 108 such as that shown in FIG. 13 is not applied.

In the example shown in FIG. 13, the curve for certain constant rotational torque has the lowest motor current value when a phase β (that is, the electric angle) of a drive current of the stator coil (the motor current) is 40° to 50°. The electric angle β at which the motor current value becomes the lowest is a maximum efficiency point of the motor 108, and in a normal operation of the vehicle, the amplitude and the phase of the motor current are controlled by controlling the inverter 107 to change pulse width and the phase of the motor current such that the motor 108 is operated at the maximum efficiency point.

For example, in the example of FIG. 13, when an uphill slope gradually becomes steeper and the larger rotational torque is thus required, the motor current and the electric angle are controlled to be changed along a maximum efficiency line in the drawing.

(Constant Current Drive of the Battery in the Motor Control Device According to the Invention)

Figure 14:
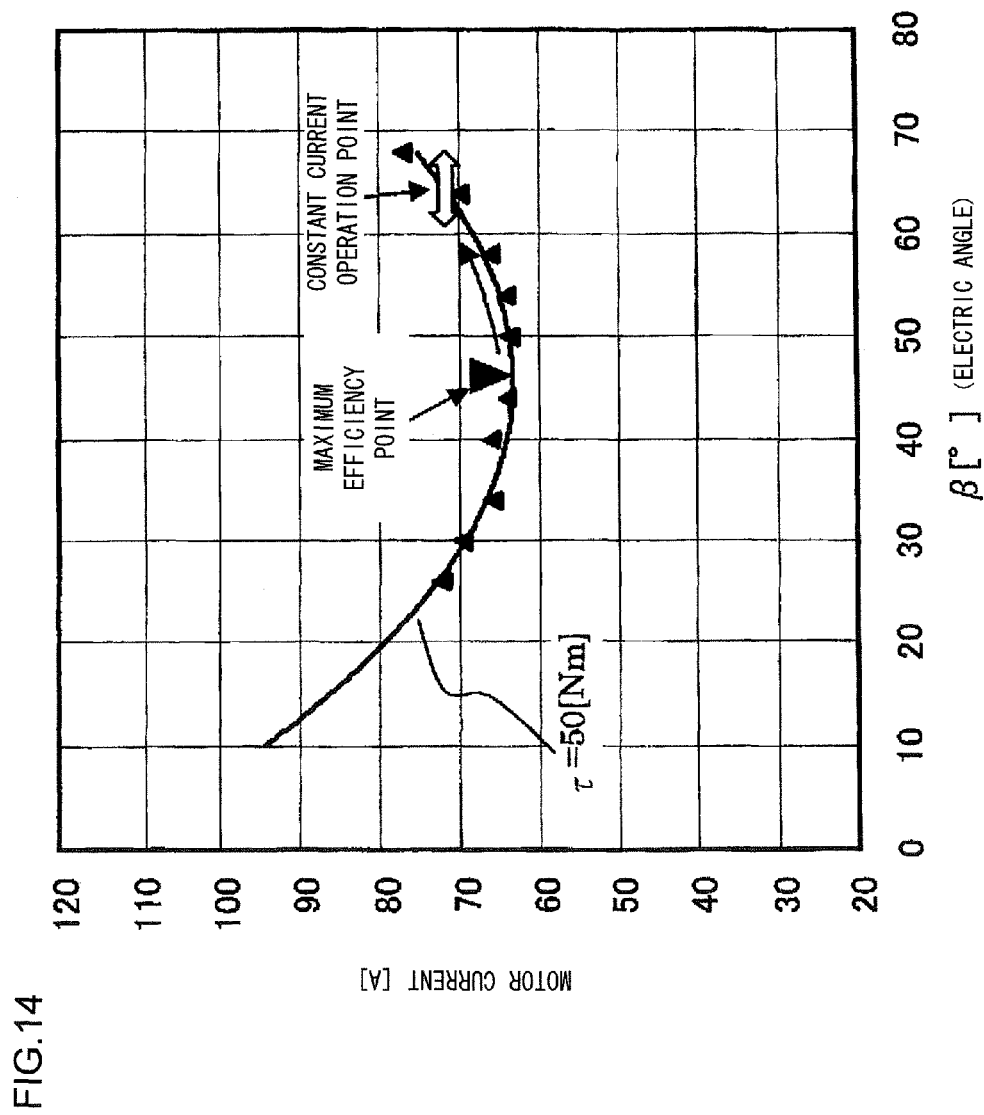
FIG. 14 is a diagram for explaining constant current drive operation of a motor by using the motor control device according to the invention.

FIG. 14 shows only one of the constant torque curves (τ=50 [Nm]) shown in FIG. 13 for ease of the description.

In the normal operation as described above, the motor controller 109 controls the inverter 107 such that the motor current and the electric angle are located at the maximum efficiency point in the drawing.

As will be described later, when it is determined that the vehicle is in a constant speed traveling state, the motor 108 is shifted to a state of the constant current drive.

A motor operation point moves from the maximum efficiency point in FIG. 14 to a predetermined constant current operation point (will be described later) along the constant torque curve on which τ=50 [Nm]. The motor operation point is moved by changing the motor current and the electric angle β thereof. Due to the constant torque state, the constant speed traveling of the vehicle is maintained. Although the motor current and the electric angle thereof can be changed linearly without following the constant torque curve, this is not preferred due to occurrence of acceleration/deceleration that is unintended by a driver.

Theoretically, the electric angle β can be increased to near 90°. However, as the electric angle approaches 90°, the motor current needs to be increased to generate the same magnitude of torque, and the loss of the motor and the like are increased, thereby lowering the efficiency as a result. In other words, because the efficiency can be controlled without changing the motor output, it is possible to control input power, that is, the battery current.

It should be noted that the constant current operation can be controlled in both a right side (β increasing direction) and a left side (β decreasing direction) of the maximum efficiency curve in FIG. 13; however, it is preferably controlled in the right side of the maximum efficiency curve because a degree of the change in the motor current that is caused by the change in the electric angle β is larger in the right side.

In addition, if the above operation is performed in both sides of the maximum efficiency curve, the two electric angles β are available at the same motor current, and the operation thus becomes unstable; therefore, such an operation is not performed.

It should be noted that, when the operation is returned from the constant current operation to the normal operation at the maximum efficiency point, the above procedure is performed in a reverse order, and the motor current and the electric angle thereof are changed from the constant current operation point along the constant torque curve.

(A Method of Setting the Constant Current Operation Point)

A description will be made on an assumption that the constant current operation is performed in the right side (β increasing direction) of the maximum efficiency curve that is shown in FIG. 13 as described above.

Theoretically, the electric angle β can be increased to 90°; however, the efficiency is lowered as the electric angle approaches 90°. The lowered efficiency results in heat generation in the motor 108 and a temperature increase of the motor; therefore, β is changed within an appropriate range in consideration of these issues. Furthermore, when the electric angle β approaches 90°, a higher motor current is required to offset the lowered efficiency, and thus β is changed in consideration of whether or not the DC current (the battery current) from the battery 103 to the inverter 107 can correspond to the higher motor current.

When a value of the rotational torque is assumed at a certain rotation speed, a minimum motor current value at which the motor 108 can output the torque (a value that corresponds to β at the maximum efficiency point) and a maximum motor current value that is determined in consideration of the heat generation in the motor 108 (corresponds to the maximum electric angle β) are each stored as a data table in a storage area of the motor controller 109, for example.

As for the two current values that correspond to the motor rotation speed and the torque in the normal operation at the maximum efficiency point, the constant current operation as described above is performed by using a motor current value located between the two motor current values that respectively correspond to the electric angle β at the maximum efficiency point and the maximum electric angle β that is determined in consideration of the heat generation and the output current of the battery in the above example.

(A Method of Determining Whether or not the Constant Current Operation is Possible)

A fluctuation range of β in the constant speed traveling of the vehicle, which is described above, can be obtained by actual measurement during driving of the vehicle or by a simulation, and the constant current operation can be performed if the fluctuation range of β is located between the above two motor current values.

In the constant current operation in the actual vehicle, a determination of whether or not the constant current operation can be performed has to be made in consideration of an amount of the dischargeable current of the battery 103 that is based on the charging state (SOC) of the battery 103.

A description will hereinafter be made on a determination method.

FIG. 3 shows examples of the data tables that are used by the second current command calculating section 216. The second current command calculating section 216 includes at least two current command tables 301, 302 that correspond to the battery current and two battery current tables 303, 304 as the data tables. The two current command tables and the two battery current tables may be tables that are based on the two motor current values (correspond to β at the maximum efficiency point and the maximum β), which are described above, for example, or may be based on values at both ends of any portion between the two motor current values.

The first current command table 301 is a current command table in which the battery current is set to the minimum within the adjustable range on the basis of the motor rotation speed (a range from N0 to Nn) and a torque command (a range from T0 to Tn). For example, when the current motor rotation speed is N1 and the torque command is T1, an obtained current command is I*11x.

The second current command table 302 is a current command table in which the battery current is set to the maximum within the adjustable range on the basis of the motor rotation speed (the range from N0 to Nn) and the torque command (the range from T0 to Tn). For example, when the current motor rotation speed is N1 and the torque command is T1, an obtained current command is I*11z. In addition, the first battery current table 303 has the output battery current that corresponds to the first current command table 301, and when the current motor rotation speed is N1 and the torque command is T1 as described above, for example, an obtained battery current value is IB11x.

The second battery current table 304 has the output battery current that corresponds to the second current command table 302, and when the current motor rotation speed is N1 and the torque command is T1 as described above, for example, an obtained battery current value is IB11z.

A method of calculating the target battery current value IB* that corresponds to the motor rotational speed N, the torque command T*, and a target current command value (the motor current value) Idq* by using the above table data will be described below.

First, the current command value that is extracted from the first current command table 301 on the basis of the motor rotation speed and the torque command is set as Idq1*, and the battery current value at the same operation point that is extracted from the first battery current table 303 is set as IB1. Next, the current command value that is extracted from the second current command table 302 on the basis of the motor rotation speed and the torque command is set as Idq2*, and the battery current value at the same operation point that is extracted from the second battery current table 304 is set as IB2.

Figure 4:
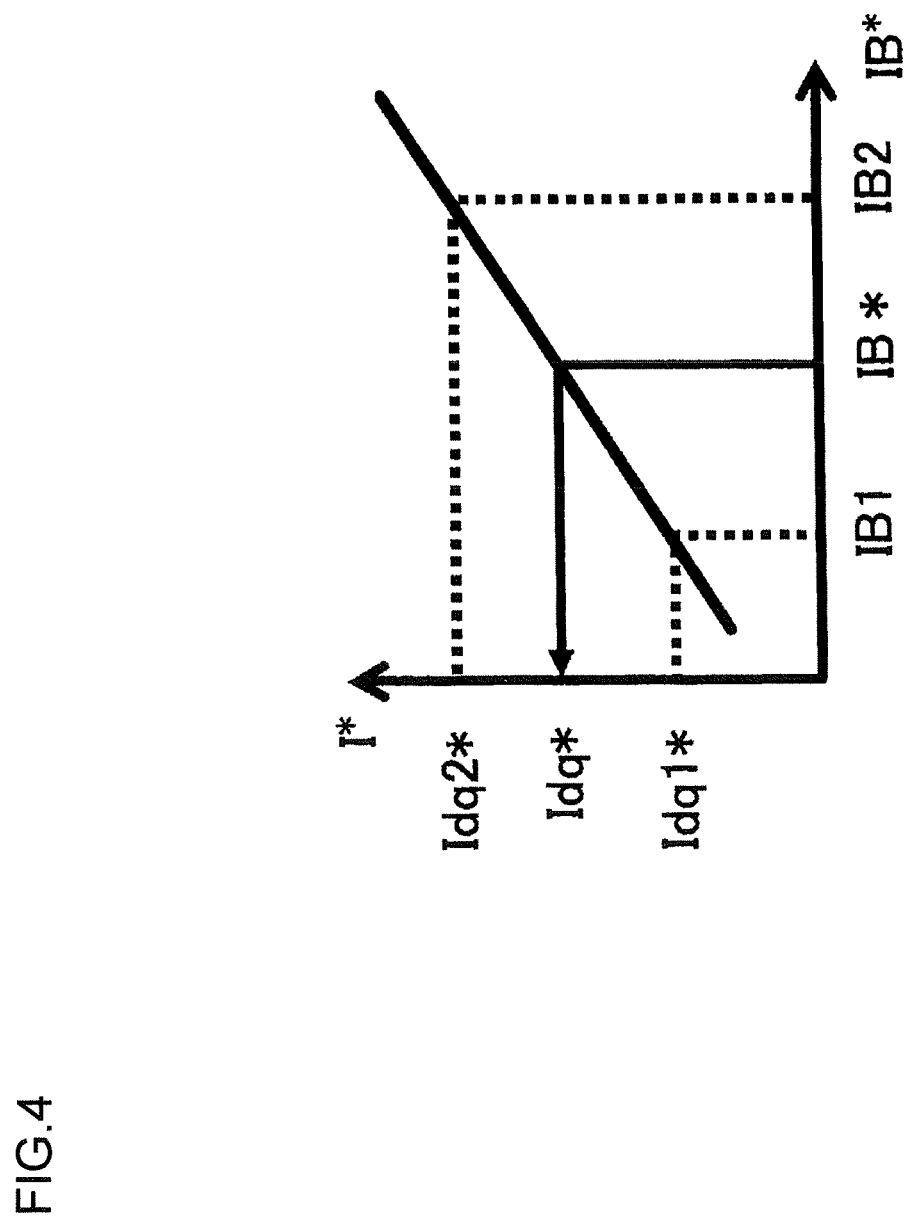
FIG. 4 shows processing of the table data shown in FIG. 3 by a current command calculating section in the motor control of the embodiment of the motor control device according to the invention.

Here, because the current command value is Idq* when the target battery current value is IB*, Idq* to be calculated establishes a relationship as shown in FIG. 4 and can be calculated from a following linear interpolation equation (1).

$$Idq^* = (Idq2^* - Idq1^*)/(IB2 - IB1) \times (IB^* - IB1) + Idq1^* \quad (1)$$

Although linear relationships are established between the value in the first current command table 301 and the value in the first battery current table 303 and between the value in the second current command table 302 and the value in the second battery current table 304, as it can be understood from FIG. 13 and the above description, the value in the first current command table 301 and the value in the second current command table 302 as well as the values in the first battery current table 303 and the second battery current table 304 are not strictly changed linearly. However, because a change in the motor current value (the first current command table 301 and the second current command table 302) and a change in the battery current value (the first battery current table 303 and the second battery current table 304) establish a linear relationship, the target battery current value IB* for the target current command value (the motor current value) Idq* can be computed from the above equation (1) by using the above equation.

It should be noted that, because battery voltage is actually fluctuated at the same output, the battery current is also fluctuated. Accordingly, the first and second battery current tables are set according to reference battery voltage VBm, and the target battery current value IB* may be converted by the reference voltage value according to a current battery voltage VB^. The converted target battery current value IB* is obtained from an equation (2).

$$IB^* = IB^* \times (VBm/VB\hat{}) \quad (2)$$

Although the current command tables are used in this embodiment, it is considered that the same current command can be obtained by another means.

As described above, it is possible in the above embodiment according to the invention to select between a normal operation mode in which the battery current fluctuates due to the fluctuation of a motor load (the rotation speed, the torque) and a constant current operation mode in which the battery current is maintained to be constant within the predetermined adjustable range even with the fluctuation of the motor load (the rotation speed, the torque).

Figure 5:
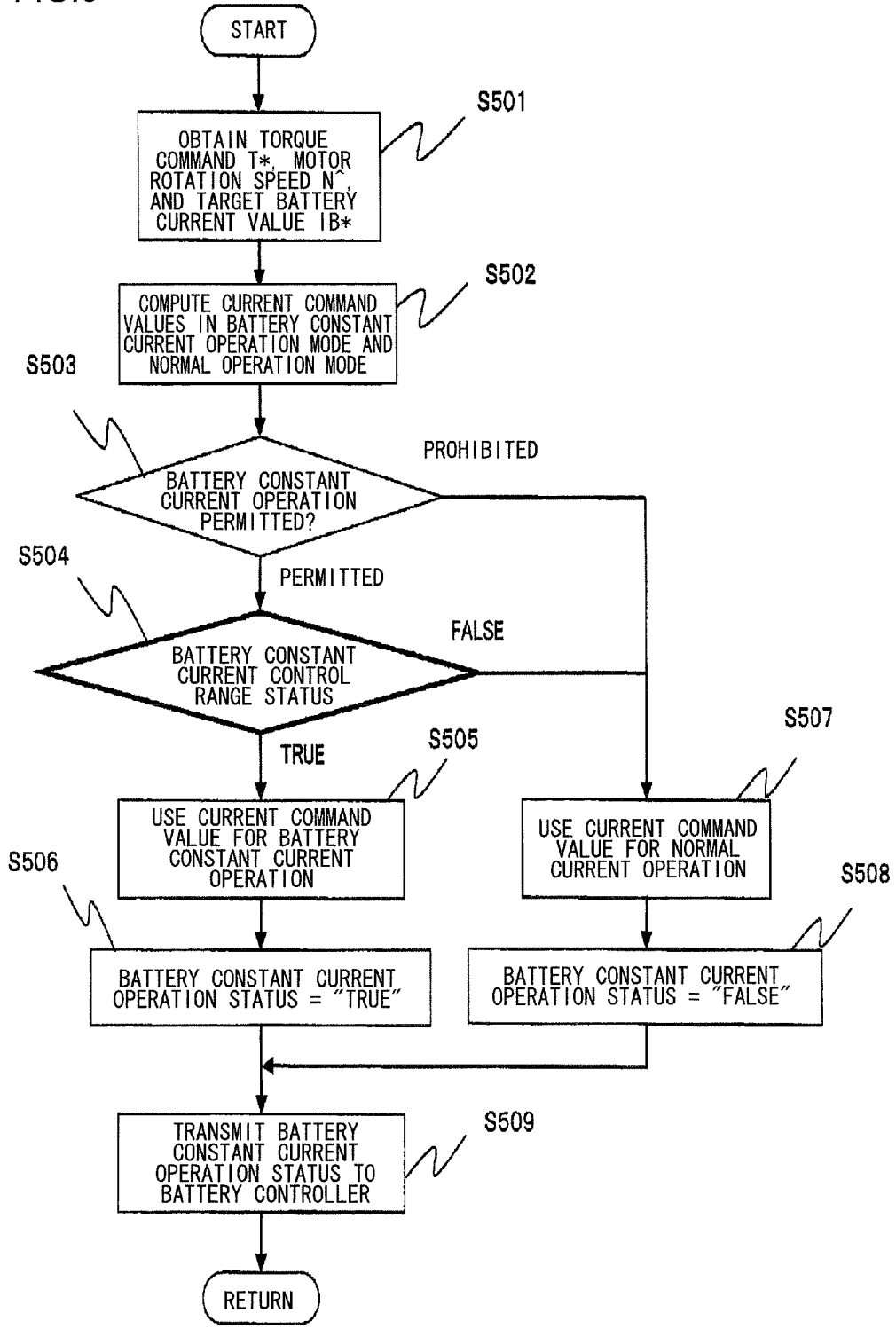
FIG. 5 is a flowchart for explaining a process of shifting to a battery constant current mode in the embodiment of the motor control device according to the invention.

FIG. 5 is a flowchart for explaining a process of shifting to processing by the motor controller 109 for controlling the motor 108 in either a battery constant current mode or a normal control mode.

First, the torque command T*, the motor rotation speed N^, and the target battery current value IB* are obtained (a step S501). Based on these data, the first and second current command calculating sections 213, 216 determine the current command values in the normal operation mode and the constant current operation mode (a step S502).

Next, it is determined whether or not battery constant current operation permission has been received from the external controller 110 (a step S503). If it is determined to be in a battery constant current operation permission state ("PERMITTED" in the step S503), it is determined whether or not the battery current target value is within a control range (a step S504). The battery constant current operation permission will be described with reference to FIG. 7 and later.

If it is determined to be controllable with the target battery current ("TRUE" in the step S504), the current command value for the battery constant current operation that is calculated in the step S02 is selected (a step S505), a battery constant current operation status is set to "TRUE" (a step S506), and the battery constant current operation is initiated.

On the other hand, if the battery constant current operation permission has not been received from the external controller 110 ("PROHIBITED" in the step S503), or if it is determined that the battery current target value is not within the control range ("FALSE" in the step S504), the current command value for the normal current operation that is calculated in the step S502 is selected (a step S507), the battery constant current operation status is set to "FALSE" (a step S508), and the normal control operation is initiated.

The battery constant current operation status set in the step S506 or the step S508 is sent to the battery controller 106 via the communication path (a step S509).

Figure 6:
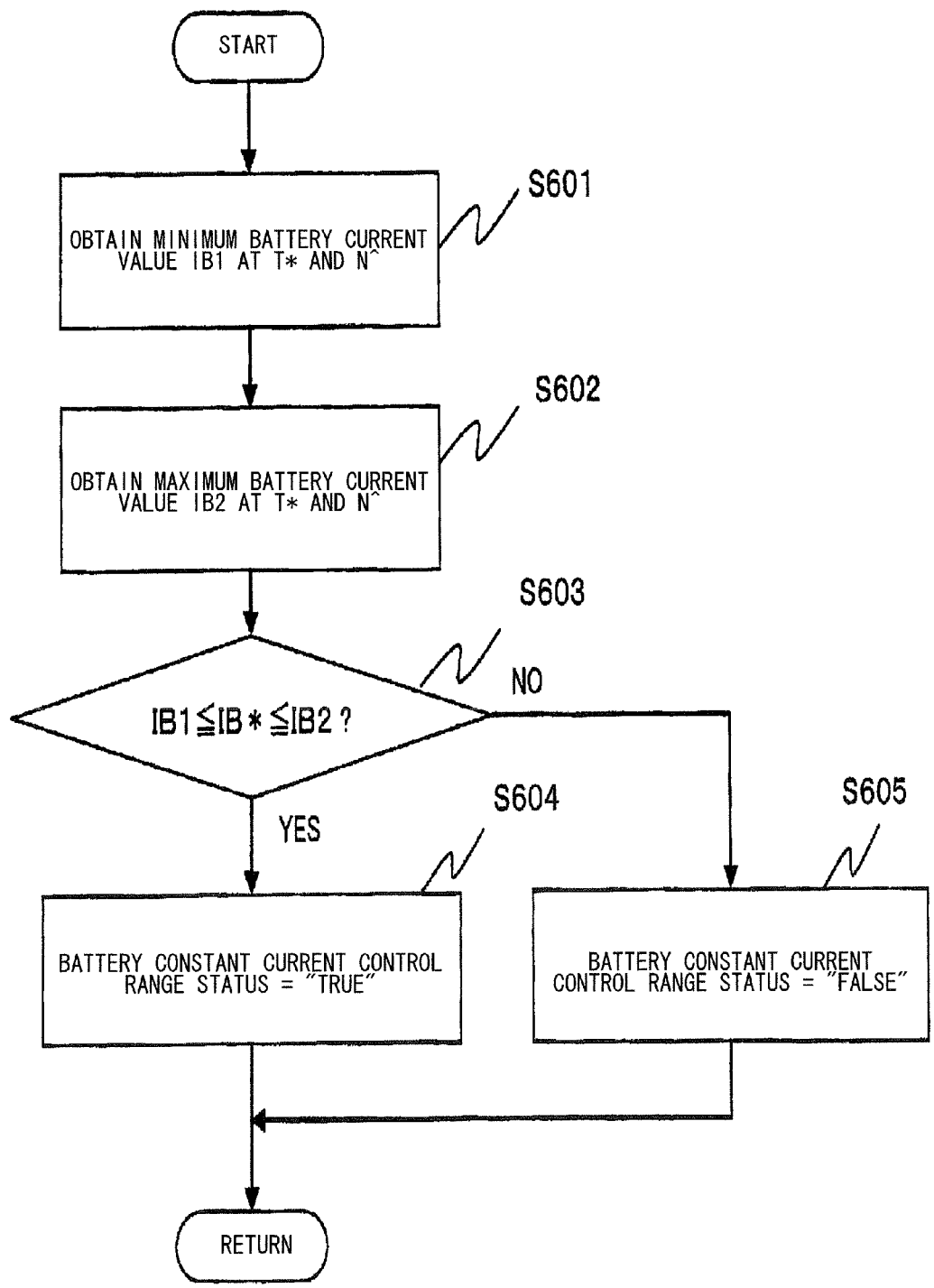
FIG. 6 is a flowchart for explaining the content of battery constant current operation range determination processing in the embodiment of the motor control device according to the invention.

FIG. 6 is a flowchart for explaining the details of the processing in the step S504 of FIG. 5. The torque command T*, the motor rotation speed NA, and the target battery current value IB* are used, and the first battery current table 303 in FIG. 3 is referred to so as to obtain the minimum battery current value IB1 (a step S601). Next, the same torque command T*, the motor rotation speed N^, and the target battery current value IB* are used, and the second battery current table 304 in FIG. 3 is referred to so as to obtain the maximum battery current value IB2 (a step S602).

If the target battery current value IB* is equal to the minimum battery current value IB1 that is obtained in the step S601 or larger and is equal to the maximum battery current value IB2 that is obtained in the step S602 or smaller (YES in a step S603), a battery constant current control range status is set to "TRUE" (a step S604). On the other hand, if the target battery current value IB* is smaller than the minimum battery current value IB1 that is obtained in the step S601 or is larger than the maximum battery current value IB2 that is obtained in the step S602 (NO in the step S603), the battery constant current control range status is set to "FALSE" (a step S605).

It should be noted that the minimum battery current value IB1 and the maximum battery current value IB2 are respectively the minimum current and the maximum current that the battery 103 can discharge. Thus, the maximum battery current value IB2 is set to a value in consideration with the charging state (SOC) of the battery 103.

After receiving the battery constant current operation status (TRUE) from the motor controller 109, the battery controller 106 calculates the SOC.

Figure 15:
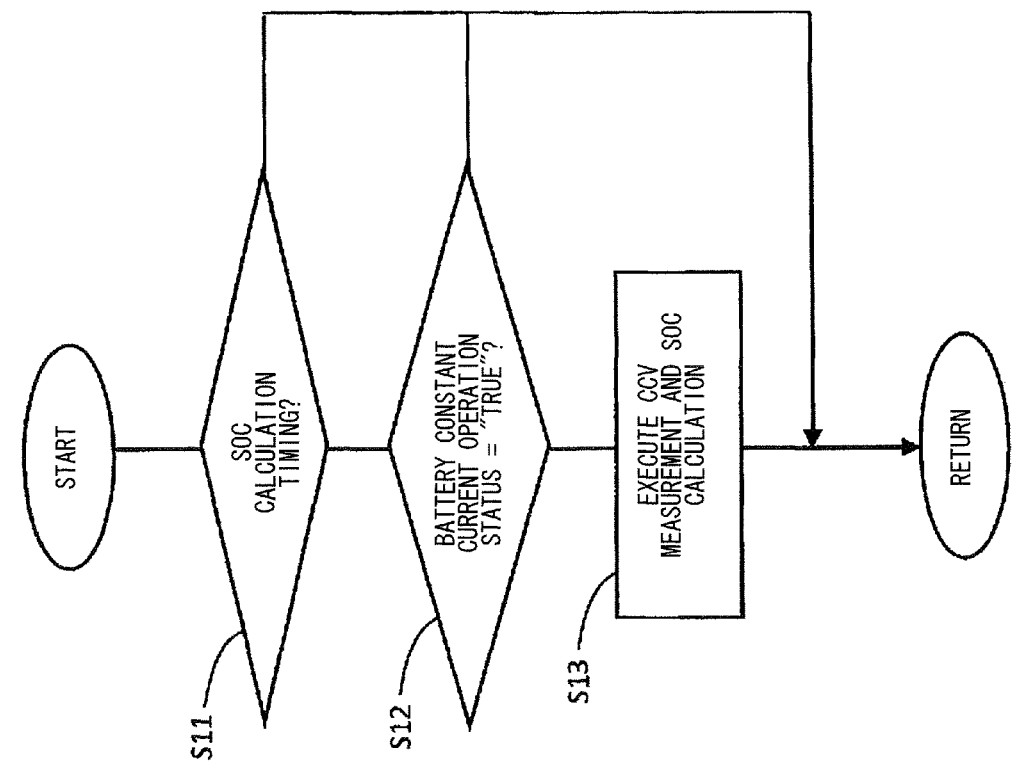
FIG. 15 is a flowchart for explaining SOC computing processing that is executed by a battery controller 106 in the electric drive apparatus for a vehicle that includes the embodiment of the motor control device according to the invention.

FIG. 15 is a flowchart for explaining SOC computing processing that is executed by the battery controller 106. It is determined in a step S11 whether or not it is SOC calculation timing. If it is determined to be the SOC calculation timing, a process proceeds to a step S12. It is determined in the step S12 whether or not the battery constant current operation status is "TRUE" (will be described later in detail). If it is determined in the step S12 that the battery constant current operation status is "TRUE", CCV measurement and SOC calculation are executed in a step S13. The CCV measurement is executed by the cell controller 104 that is controlled by the battery controller 106. If the steps S11 and S12 are negative, the step S13 is skipped.

It should be noted that information on whether or not it is the SOC calculation timing and information of the battery constant current operation status are sent from the external controller 110 that is a host controller to the battery controller 106 together with a command to execute an operation in FIG. 15, for example.

Various traveling states of the vehicle based on which the external controller 110 determines whether or not the battery constant current operation status is "TRUE" will hereinafter be described with reference to FIG. 7 to FIG. 12.

FIG. 7 to FIG. 12 are flowcharts for explaining a first example to a sixth example of the battery constant current operation permission for which the motor control device of the embodiment according to the invention can be used. In these cases, the vehicle is mostly in the constant speed traveling state.

First Example

Figure 7:
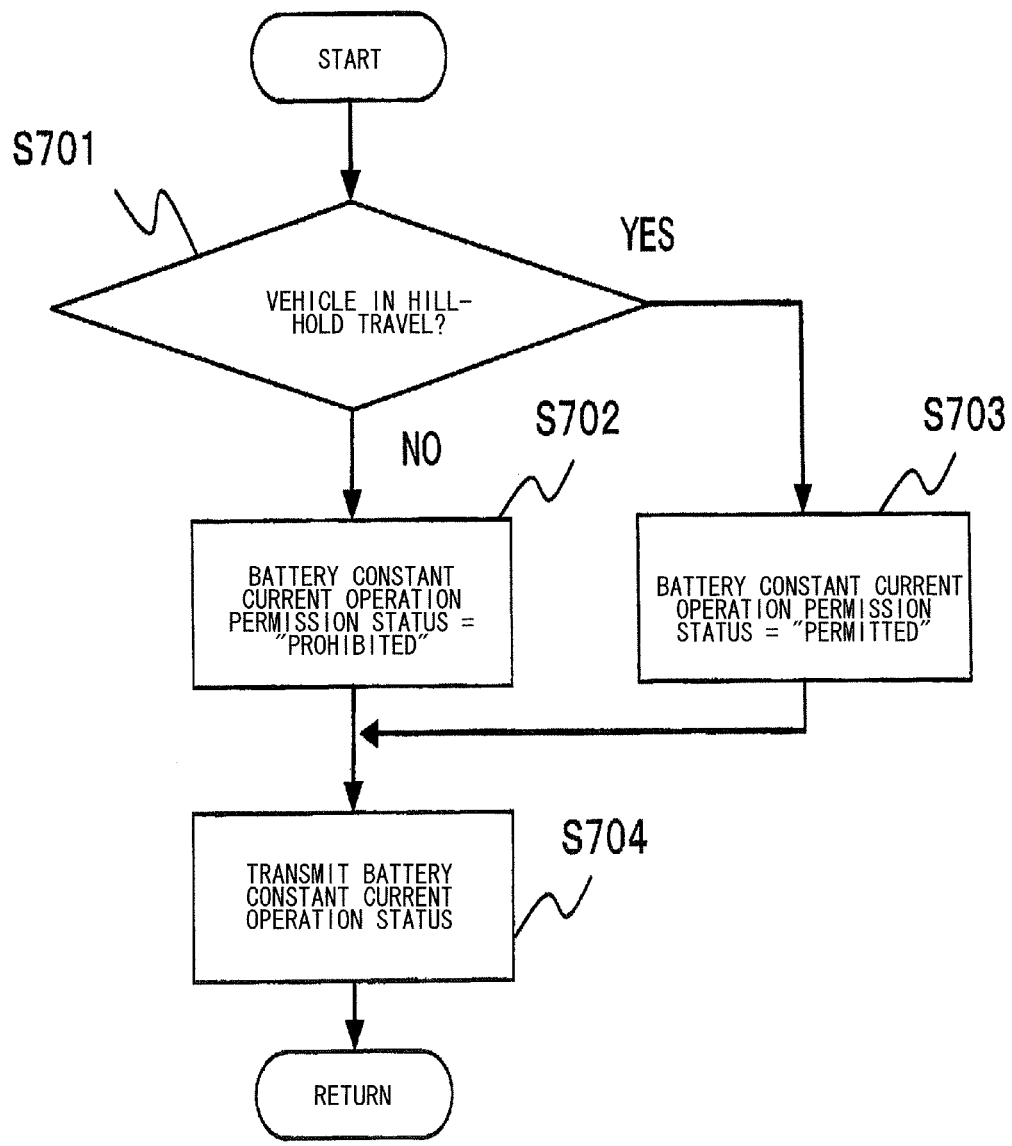
FIG. 7 is a flowchart for explaining a first example of battery constant current operation permission for which the motor control device of the embodiment according to the invention can be used.

FIG. 7 is a flowchart for explaining the constant current operation permission in the motor control device when a vehicle is in a hill-hold travel.

The external controller 110 determines whether or not the vehicle is currently in the hill-hold travel (a step S701). If it is determined that the vehicle is in the bill-hold travel (YES in the step S701), a battery constant current operation permission status is set to "PERMITTED" (a step S703).

On the other hand, if the vehicle is not in the hill-hold travel (NO in the step S701), the battery constant current operation permission status is set to "PROHIBITED" (a step S702). The external controller 110 transmits the battery constant current operation status to the motor controller 109 and the battery controller 106 (a step S704).

Second Example

Figure 8:
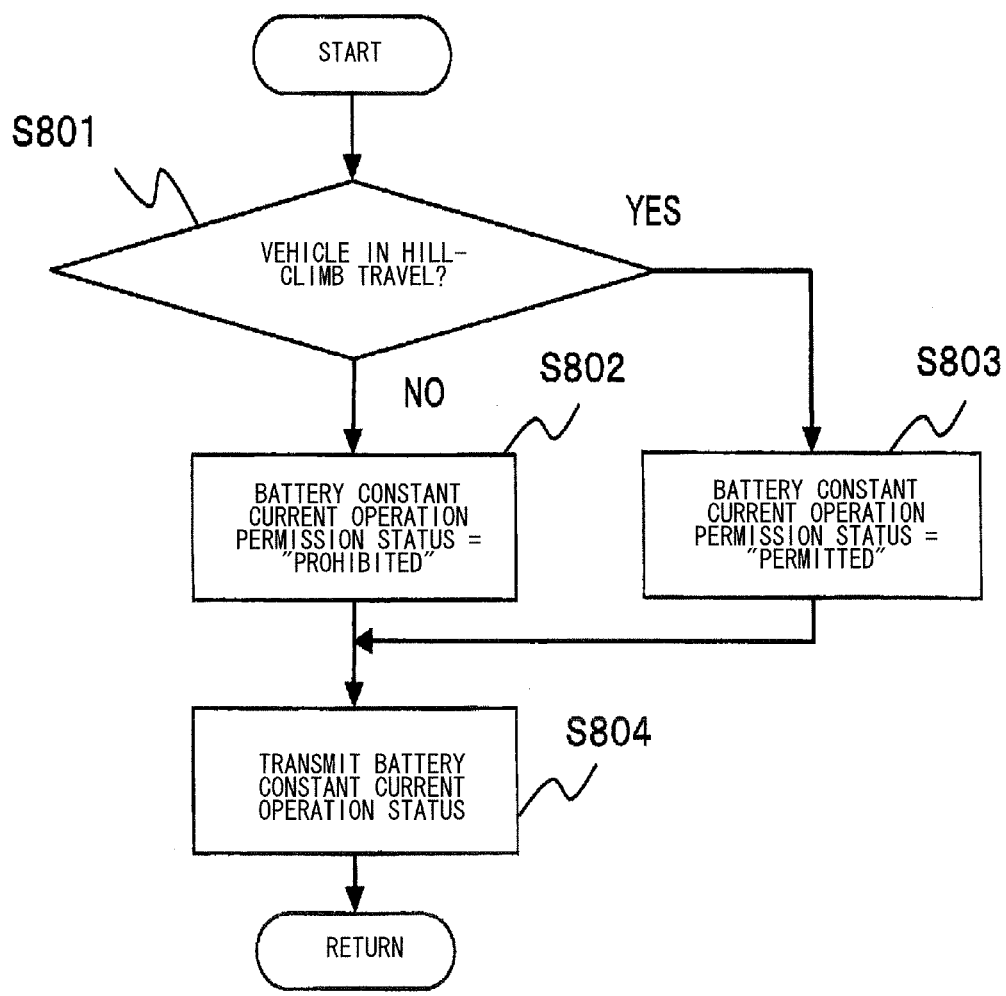
FIG. 8 is a flowchart for explaining a second example of the battery constant current operation permission for which the motor control device of the embodiment according to the invention can be used.

FIG. 8 is a flowchart for explaining the constant current operation permission in the motor control device when the vehicle is in a hill-climb travel.

The external controller 110 determines whether or not the vehicle is currently in the hill-climb travel (a step S801). If it is determined that the vehicle is in the hill-climb travel (YES in the step S801), the battery constant current operation permission status is set to "PERMITTED" (a step S803).

On the other hand, when the vehicle is not in the hill-climb travel (NO in the step S801), the battery constant current operation permission status is set to "PROHIBITED" (a step S802). The external controller 110 transmits the battery constant current operation status to the motor controller 109 and the battery controller 106 (a step S804).

Third Example

Figure 9:
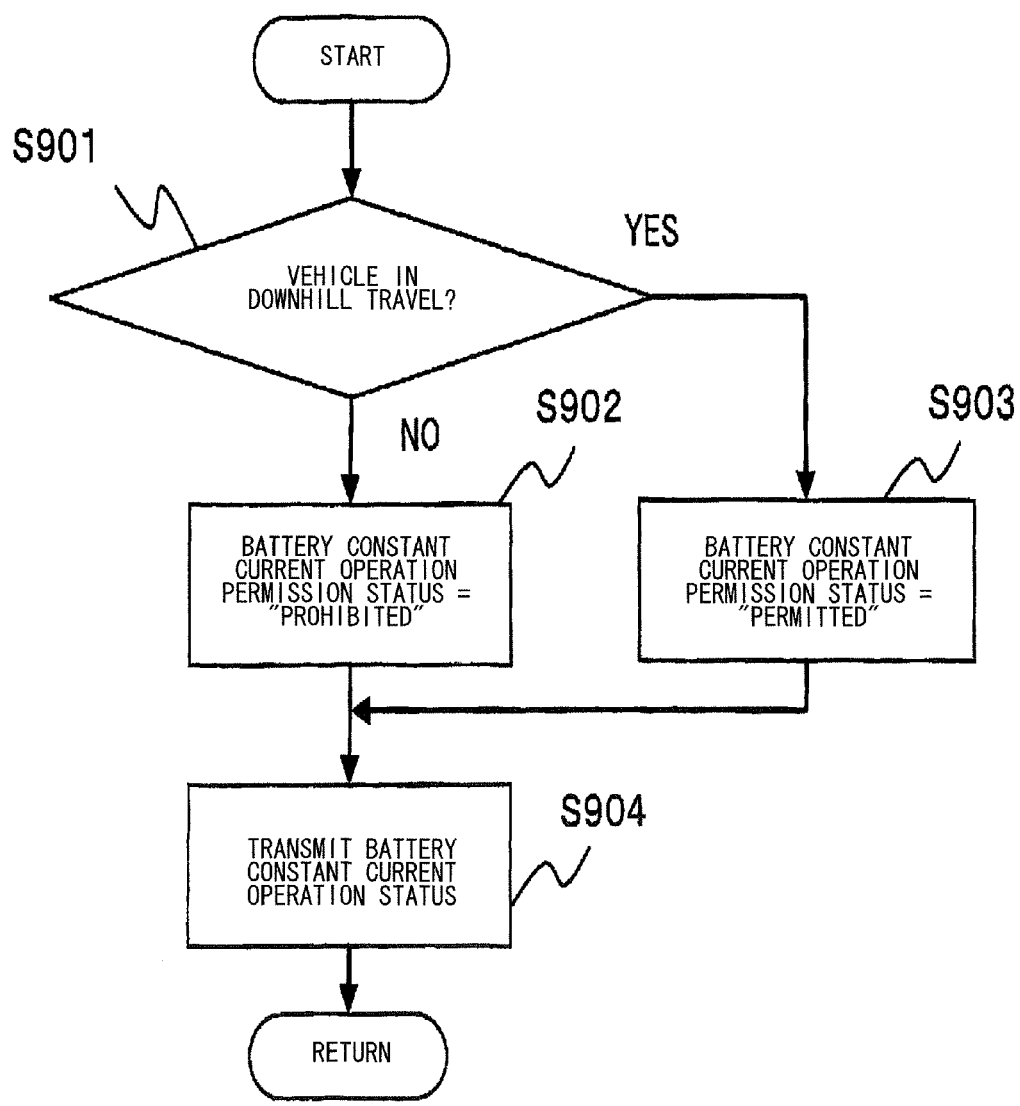
FIG. 9 is a flowchart for explaining a third example of the battery constant current operation permission for which the motor control device of the embodiment according to the invention can be used.

FIG. 9 is a flowchart for explaining the constant current operation permission in the motor control device when the vehicle is in a downhill travel. When the vehicle is in the downhill travel at the constant speed, the motor 108 does not operate by receiving the AC current from the inverter 107 but performs the regenerative operation. However, due to the constant speed, a power generation amount of the motor 108 is constant, and the DC current flowing through the battery 103 is stabilized as in the constant current operation of the motor 108; therefore, the CCV of the secondary battery cell that forms the battery 103 can be measured accurately.

The external controller 110 determines whether or not the vehicle is currently in a downhill travel (a step S901). If it is determined that the vehicle is in the downhill travel (YES in the step S901), the battery constant current operation permission status is set to "PERMITTED" (a step S903).

If the vehicle is not in the downhill travel (NO in the step S901), the battery constant current operation permission status is set to "PROHIBITED" (a step S902). The external controller 110 transmits the battery constant current operation status to the motor controller 109 and the battery controller 106 (a step S904).

Fourth Example

Figure 10:
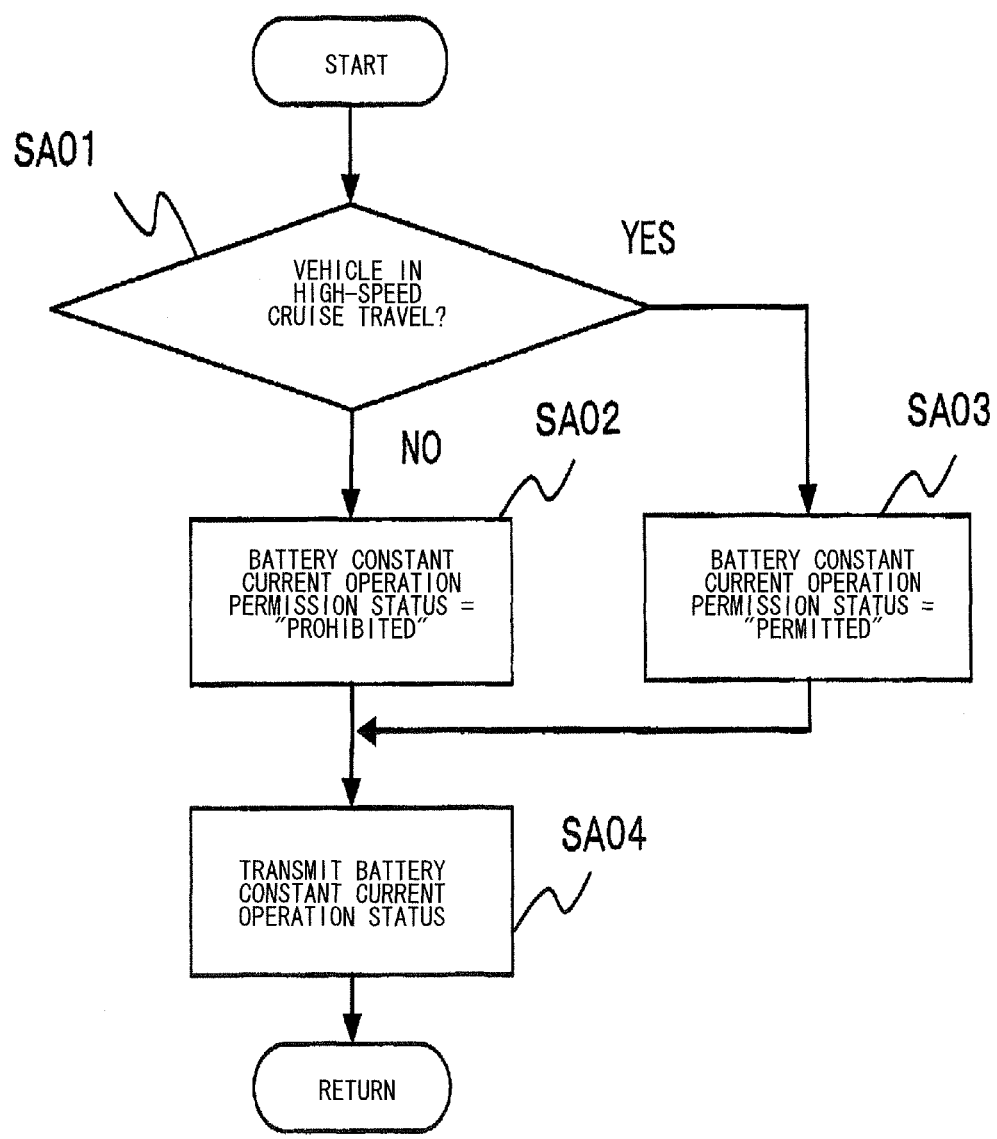
FIG. 10 is a flowchart for explaining a fourth example of the battery constant current operation permission for which the motor control device of the embodiment according to the invention can be used.

FIG. 10 is a flowchart for explaining the constant current operation permission in the motor control device when the vehicle is in a high-speed cruise travel.

The external controller 110 determines whether or not the vehicle is currently in the high-speed cruise travel (a step SA01). If it is determined that the vehicle is in the high-speed cruise travel (YES in the step SA01), the battery constant current operation permission status is set to "PERMITTED" (a step SA03).

On the other hand, if the vehicle is not in the high-speed cruise travel (NO in the step SA01), the battery constant current operation permission status is set to "PROHIBITED" (a step SA02). The external controller 110 transmits the battery constant current operation status to the motor controller 109 and the battery controller 106 (a step SA04).

Fifth Example

Figure 11:
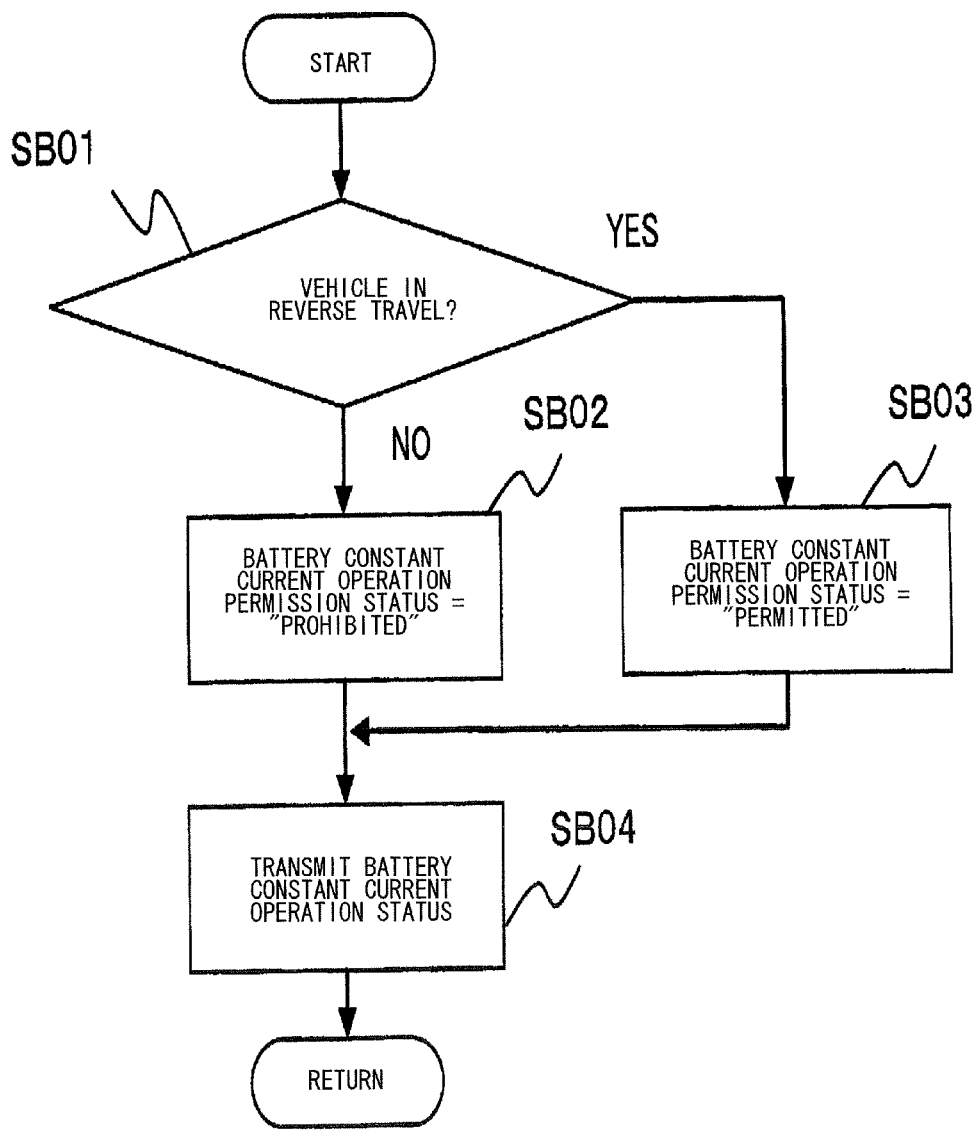
FIG. 11 is a flowchart for explaining a fifth example of the battery constant current operation permission for which the motor control device of the embodiment according to the invention can be used.

FIG. 11 is a flowchart for explaining the constant current operation permission in the motor control device when the vehicle is in a reverse travel.

The external controller 110 determines whether or not the vehicle is currently in the reverse travel (a step SB01). If it is determined that the vehicle is in the reverse travel (YES in the step SB01), the battery constant current operation permission status is set to "PERMITTED" (a step SB03).

On the other hand, if the vehicle is not in the reverse travel (NO in the step SB01), the battery constant current operation permission status is set to "PROHIBITED" (a step SB02). The external controller 110 transmits the battery constant current operation status to the motor controller 109 and the battery controller 106 (a step SB04).

Sixth Example

Figure 12:
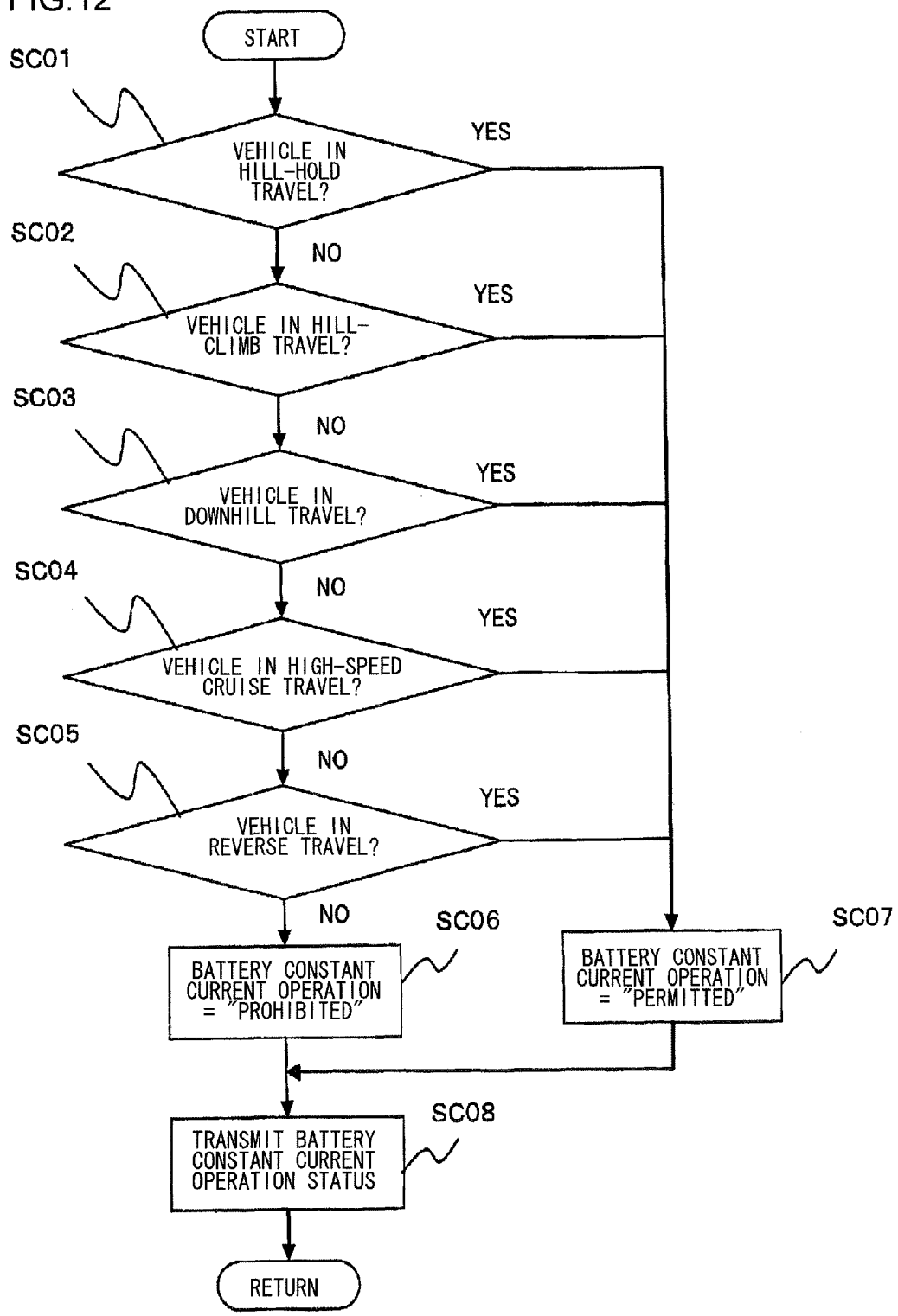
FIG. 12 is a flowchart for explaining a sixth example of the battery constant current operation permission for which the motor control device of the embodiment according to the invention can be used.

FIG. 12 is a flowchart for explaining a sixth example of the constant current operation permission in the motor control device according to the invention.

In this embodiment, processing in the first to fifth examples is integrated. According to the processing, when any one of the conditions described in the first to fifth examples is satisfied, the battery constant current operation status is set to "PERMITTED" (a step SC07).

On the other hand, when none of the conditions is satisfied, the battery constant current operation status is set to "PROHIBITED" (a step SC06). The external controller 110 transmits the battery constant current operation status to the motor controller 109 and the battery controller 106 (a step SC08).

In any of the examples, the battery controller 106 compares an SOC calculation result when the battery current fluctuates with the SOC calculation result during the battery constant current operation and corrects the SOC calculation result.

It should be noted that the invention is not limited to the above embodiments but includes various modifications. For example, the above embodiments are described in detail for ease of understanding but are not necessarily limited to the embodiments that encompass the entire configuration described above. In addition, the configuration of one embodiment can partially be replaced by the configuration of another embodiment, and the configuration of another embodiment can be added to the configuration of the one embodiment. Furthermore, the configuration of each embodiment can partially be removed, and the configuration of another embodiment can partially be added to or replaced with the configuration of each embodiment.

The configuration, functions, processing, and the like of the above embodiments may partially or entirely be realized by hardware by designing them in an integrated circuit, for example. The configuration, functions, and the like of the above embodiments may be realized by software, a program of which realizes each of the functions and is interpreted and executed by a processor. Information on a program, a table, and a file as components that realize the above functions may be stored in a recording device such as a memory, a hard disc, or a solid state drive (SSD) or in a recording medium such as an IC card, an SD card, or a DVD. Control lines and communication lines that are necessary for the description are only shown, and all of the control lines and the communication lines in a product are not necessarily shown. It can be assumed that almost all of these components are actually connected to each other.

Various embodiments and modifications have been described so far; however, the invention is not limited thereto. Other aspects that can be considered to fall within the scope of the technical idea of the invention are also included in the scope of the invention.

The disclosure of the following priority application is incorporated herein by reference in its entirety.

Japanese Patent Application No. 2011-209814 (filed on Sep. 26, 2011)

The invention claimed is:
1. A motor control device comprising:
   a mode setting section that sets one of a first mode in which a charge/discharge current of a secondary battery is changed according to a load fluctuation of a motor and a second mode in which the charge/discharge current of the secondary battery is set as a target battery current value configured to maintain the charge/discharge current of the secondary battery constant within a predetermined adjustable range regardless of the load fluctuation of the motor; and a drive signal generating section that generates a first current command signal configured to charge the charge/discharge current of the secondary battery according to a load fluctuation of the motor when the first mode is set by the mode setting section and generates a second current command signal configured to maintain the charge/discharge current of the secondary battery constant as the target battery current value when the second mode is set by the mode setting section, wherein the mode setting section sets one of the first mode and the second mode based on a signal from an external controller, the mode setting section sets the second mode during a high-speed cruise travel in which torque fluctuation of the motor is relatively small, the drive signal generating section comprises:
- a first current command calculating section that outputs the first current command signal on the basis of an inter-terminal voltage of the secondary battery, a torque command value for driving the motor, and a motor rotation speed;
- a second current command calculating section that outputs the second current command signal on the basis of an inter-terminal voltage of the secondary battery, the torque command value for driving the motor, the motor rotation speed, and the target battery current value, and
- a current command switching section that selects and outputs one of the first current command signal and the second current command signal; and the motor is driven on the basis of a current command signal that is output from the current command switching section.

2. The motor control device according to claim 1, wherein the mode setting section sets the second mode during a hill-hold travel in which torque fluctuation of the motor is relatively small.

3. The motor control device according to claim 1, wherein the mode setting section sets the second mode during a hill-climb travel in which torque of the motor acts only in a discharging direction.

4. The motor control device according to claim 1, wherein the mode setting section sets the second mode during a downhill travel in which torque of the motor acts only in a charging direction.

5. The motor control device according claim 1, wherein the mode setting section sets the second mode during a reverse travel in which torque fluctuation of the motor is relatively small.

6. An electric drive control apparatus for a vehicle comprising:
the motor control device according to claim 1;
a secondary battery voltage measuring section that measures inter-terminal voltage (CCV) of the secondary battery when the motor is driven in the second mode; and
an SOC calculating section that calculates OCV of the secondary battery based on the inter-terminal voltage (CCV) of the secondary battery measured by the secondary battery voltage measuring section.

7. A control apparatus for a vehicle comprising:
the motor control device according to claim 1;
a secondary battery voltage measuring section that measures inter-terminal voltage (CCV) of the secondary battery when the motor is driven in the second mode;
an SOC calculating section that calculates OCV of the secondary battery based on the inter-terminal voltage (CCV) of the secondary battery measured by the secondary battery voltage measuring section;
a first determining section that determines one of hill-hold, hill-climb, high-speed cruise, and reverse travels; and
a command section that commands the motor control device to set the second mode when the determining section determines one of the hill-hold, hill-climb, high-speed cruise, and reverse travels.

8. The motor control device according to claim 7, wherein
the mode setting section comprises:
- a first table section that derives a minimum battery current value defined based on a torque command value and a motor rotation speed;
- a second table section that derives a maximum battery current value defined based on the torque command value and the motor rotation speed; and
- a second determining section that determines whether the target battery current value is within a motor control range when the target battery current value is equal to the minimum battery current value or larger and is equal to the maximum battery current value or smaller, and
when the determination by the second determining section is affirmative, the second mode is set by the mode setting section.

* * * * *